(12) United States Patent
Kim et al.

(10) Patent No.: US 9,570,675 B2
(45) Date of Patent: Feb. 14, 2017

(54) MAGNETORESISTIVE STRUCTURES, MAGNETIC RANDOM-ACCESS MEMORY DEVICES INCLUDING THE SAME AND METHODS OF MANUFACTURING THE MAGNETORESISTIVE STRUCTURE

(71) Applicants: Kee-won Kim, Suwon-si (KR); Kwang-seok Kim, Seoul (KR); Sung-chul Lee, Osan-si (KR); Young-man Jang, Hwaseong-si (KR); Ung-hwan Pi, Seoul (KR)

(72) Inventors: Kee-won Kim, Suwon-si (KR); Kwang-seok Kim, Seoul (KR); Sung-chul Lee, Osan-si (KR); Young-man Jang, Hwaseong-si (KR); Ung-hwan Pi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 50 days.

(21) Appl. No.: 14/167,553

(22) Filed: Jan. 29, 2014

(65) Prior Publication Data

US 2014/0252519 A1    Sep. 11, 2014

(30) Foreign Application Priority Data

Mar. 11, 2013 (KR) .......................... 10-2013-0025745

(51) Int. Cl.
  *H01L 43/12* (2006.01)
  *H01L 43/08* (2006.01)
  *H01L 27/22* (2006.01)

(52) U.S. Cl.
  CPC ............... *H01L 43/12* (2013.01); *H01L 43/08* (2013.01); *H01L 27/228* (2013.01)

(58) Field of Classification Search
  CPC ........ H01L 43/12; H01L 27/222; H01L 43/08; H01L 27/228
  See application file for complete search history.

(56) References Cited

U.S. PATENT DOCUMENTS 5,731,936 A * 3/1998 Lee et al. ................. 360/327.22
6,090,480 A * 7/2000 Hayashi ................. B82Y 10/00
                                                      257/E43.004

(Continued)

FOREIGN PATENT DOCUMENTS

JP    2004-214251 A    7/2004
JP    2006-165031 A    6/2006

(Continued)

OTHER PUBLICATIONS

Katine, J. A. "Current-Driven Magnetization Reversal and Spin-Wave Excitations in Co/Cu/Co Pillars" Phys. Rev. Lett. vol. 84, No. 14 Apr. 3, 2000 pp. 3149-3152), and in view of Pinarbasi (U.S. Pat. No. 6,208,491 patented Mar. 27, 2001.*

*Primary Examiner* — Matthew Landau
*Assistant Examiner* — Grant Withers
(74) *Attorney, Agent, or Firm* — Harness, Dickey & Pierce, P.L.C.

(57) ABSTRACT

Magnetoresistive structures, magnetic random-access memory devices including the same, and methods of manufacturing the magnetoresistive structure, include a first magnetic layer having a magnetization direction that is fixed, a second magnetic layer corresponding to the first magnetic layer, wherein a magnetization direction of the second magnetic layer is changeable, and a magnetoresistance (MR) enhancing layer and an intermediate layer both between the first magnetic layer and the second magnetic layer.

17 Claims, 8 Drawing Sheets

(56) References Cited

U.S. PATENT DOCUMENTS

| | | | |
|---|---|---|---|
| 6,153,320 A * | 11/2000 | Parkin | 428/811.2 |
| 6,208,491 B1 * | 3/2001 | Pinarbasi | 360/324.1 |
| 6,322,640 B1 * | 11/2001 | Xiao | B82Y 25/00 |
| | | | 148/308 |
| 6,456,469 B1 * | 9/2002 | Gill | 360/324.11 |
| 6,581,272 B1 * | 6/2003 | Li et al. | 29/603.14 |
| 6,621,667 B1 * | 9/2003 | He et al. | 360/324.12 |
| 6,643,915 B2 * | 11/2003 | Gill | 29/603.14 |
| 6,654,211 B2 * | 11/2003 | Gill et al. | 360/324.12 |
| 6,667,861 B2 * | 12/2003 | Gill | 360/324.11 |
| 6,709,767 B2 * | 3/2004 | Lin et al. | 428/814 |
| 6,731,477 B2 * | 5/2004 | Lin et al. | 360/324.1 |
| 6,735,060 B2 * | 5/2004 | Gill | 360/324.1 |
| 6,785,954 B2 * | 9/2004 | Horng et al. | 29/603.14 |
| 7,173,796 B2 * | 2/2007 | Freitag et al. | 360/324.1 |
| 7,268,977 B2 * | 9/2007 | Freitag et al. | 360/324.1 |
| 7,307,818 B1 * | 12/2007 | Park et al. | 360/324.1 |
| 7,695,761 B1 * | 4/2010 | Shen et al. | 427/127 |
| 7,787,221 B2 * | 8/2010 | Nakabayashi et al. | 360/324.2 |
| 7,821,747 B2 * | 10/2010 | Gill | 360/324.2 |
| 8,085,511 B2 * | 12/2011 | Yuasa | B82Y 10/00 |
| | | | 257/421 |
| 8,130,474 B2 * | 3/2012 | Childress et al. | 360/324.2 |
| 8,169,753 B2 * | 5/2012 | Lin | 360/324.12 |
| 8,493,695 B1 * | 7/2013 | Kaiser et al. | 360/324.12 |
| 8,914,970 B2 * | 12/2014 | Katine | 29/603.16 |
| 8,982,614 B2 * | 3/2015 | Nagamine et al. | 365/158 |
| 8,987,850 B2 * | 3/2015 | Oh et al. | 257/422 |
| 2002/0054462 A1 * | 5/2002 | Sun et al. | 360/324.2 |
| 2003/0049389 A1 * | 3/2003 | Tsunekawa et al. | 427/569 |
| 2003/0133232 A1 * | 7/2003 | Li et al. | 360/324.1 |
| 2003/0175997 A1 * | 9/2003 | Kyler et al. | 438/3 |
| 2003/0179511 A1 * | 9/2003 | Xiao et al. | 360/324.2 |
| 2003/0184918 A1 * | 10/2003 | Lin et al. | 360/314 |
| 2004/0115478 A1 * | 6/2004 | Qian et al. | 428/692 |
| 2005/0006682 A1 * | 1/2005 | Bae et al. | 257/295 |
| 2005/0136600 A1 * | 6/2005 | Huai | 438/296 |
| 2005/0201022 A1 * | 9/2005 | Horng et al. | 360/324.11 |
| 2006/0003185 A1 * | 1/2006 | Parkin | 428/692.1 |
| 2006/0061915 A1 * | 3/2006 | Zhang | B82Y 10/00 |
| | | | 360/324.11 |
| 2006/0132984 A1 * | 6/2006 | Kajiyama et al. | 360/317 |
| 2007/0015293 A1 * | 1/2007 | Wang et al. | 438/3 |
| 2007/0176251 A1 * | 8/2007 | Oh et al. | 257/421 |
| 2007/0205766 A1 * | 9/2007 | Kou | 324/252 |
| 2008/0219042 A1 * | 9/2008 | Wang | G11C 11/15 |
| | | | 365/158 |
| 2009/0162698 A1 * | 6/2009 | Fukuzawa et al. | 428/811.2 |
| 2009/0180210 A1 * | 7/2009 | Lee et al. | 360/59 |
| 2009/0251829 A1 * | 10/2009 | Zhang et al. | 360/319 |
| 2010/0193888 A1 * | 8/2010 | Gu et al. | 257/421 |
| 2011/0133299 A1 * | 6/2011 | Zhu et al. | 257/421 |
| 2011/0183158 A1 * | 7/2011 | Zhang | B82Y 40/00 |
| | | | 428/811.1 |
| 2011/0260270 A1 * | 10/2011 | Zhang et al. | 257/421 |
| 2011/0272380 A1 * | 11/2011 | Jeong et al. | 216/22 |
| 2012/0038428 A1 * | 2/2012 | Lee et al. | 331/108 R |
| 2012/0038430 A1 * | 2/2012 | Kim et al. | 331/154 |
| 2012/0244640 A1 * | 9/2012 | Ohsawa et al. | 438/3 |
| 2013/0065075 A1 * | 3/2013 | Pruegl et al. | 428/611 |
| 2013/0161769 A1 * | 6/2013 | Lee et al. | 257/421 |
| 2013/0175646 A1 * | 7/2013 | Kim et al. | 257/421 |
| 2013/0221459 A1 * | 8/2013 | Jan | H01L 43/08 |
| | | | 257/421 |
| 2013/0224521 A1 * | 8/2013 | Wang et al. | 428/828 |
| 2014/0015073 A1 * | 1/2014 | Lee et al. | 257/421 |
| 2014/0022839 A1 * | 1/2014 | Park et al. | 365/171 |
| 2014/0063921 A1 * | 3/2014 | Tang et al. | 365/158 |
| 2014/0151830 A1 * | 6/2014 | Apalkov et al. | 257/427 |
| 2014/0170778 A1 * | 6/2014 | Ikeda | 438/3 |
| 2014/0183673 A1 * | 7/2014 | Zhang | H01L 29/82 |
| | | | 257/421 |
| 2014/0211552 A1 * | 7/2014 | Pi et al. | 365/158 |
| 2014/0252439 A1 * | 9/2014 | Guo | 257/295 |
| 2014/0252519 A1 * | 9/2014 | Kim et al. | 257/427 |
| 2014/0264671 A1 * | 9/2014 | Chepulskyy et al. | 257/421 |
| 2014/0269036 A1 * | 9/2014 | Pi et al. | 365/158 |
| 2014/0327095 A1 * | 11/2014 | Kim et al. | 257/421 |
| 2014/0339660 A1 * | 11/2014 | Lee et al. | 257/421 |
| 2015/0001654 A1 * | 1/2015 | Sandhu et al. | 257/421 |
| 2015/0021675 A1 * | 1/2015 | Min | 257/295 |
| 2015/0028440 A1 * | 1/2015 | Liu et al. | 257/421 |
| 2015/0069549 A1 * | 3/2015 | Tomioka et al. | 257/421 |
| 2015/0069552 A1 * | 3/2015 | Hashimoto et al. | 257/421 |
| 2015/0069560 A1 * | 3/2015 | Cho et al. | 257/421 |
| 2015/0069561 A1 * | 3/2015 | Tan et al. | 257/421 |
| 2015/0076485 A1 * | 3/2015 | Sandhu et al. | 257/43 |
| 2015/0076633 A1 * | 3/2015 | Siddik et al. | 257/421 |
| 2015/0200357 A1 * | 7/2015 | Krounbi | H01L 43/12 |
| | | | 257/421 |

FOREIGN PATENT DOCUMENTS

| | | |
|---|---|---|
| JP | 2010-205928 A | 9/2010 |
| KR | 2003-0002141 A | 1/2003 |
| KR | 2003-0097904 A | 12/2003 |
| KR | 2006-0039748 A | 5/2006 |
| KR | 10-0650465 B1 | 11/2006 |
| KR | 10-0706806 B1 | 4/2007 |
| KR | 2008-0044298 A | 5/2008 |
| KR | 2011-0122722 A | 11/2011 |

* cited by examiner

MAGNETORESISTIVE STRUCTURES, MAGNETIC RANDOM-ACCESS MEMORY DEVICES INCLUDING THE SAME AND METHODS OF MANUFACTURING THE MAGNETORESISTIVE STRUCTURE

CROSS-REFERENCE TO RELATED APPLICATIONS

This application claims the benefit of priority under 35 U.S.C. §119 from Korean Patent Application No. 10-2013-0025745, filed on Mar. 11, 2013, in the Korean Intellectual Property Office, the disclosure of which is incorporated herein in its entirety by reference.

BACKGROUND

1. Field

Example embodiments relate to magnetoresistive structures, magnetic random-access memory devices including the same, and/or methods of manufacturing the magnetoresistive structure.

2. Description of the Related Art

As thin-film deposition technology and surface processing technology in a high-vacuum state have rapidly developed, it has become possible to precisely grow a magnetic thin film within a thickness of several nanometers (nm) to be used in the manufacture a magnetic random-access memory device. The thickness of the magnetic thin film is grown so as to match an exchange interaction distance between spins of a magnetic random-access memory device. Accordingly, various phenomena have been discovered which were not observed from a magnetic material in a bulk form, and thus these various phenomena are being applied to home appliances and industrial components, for example, a magnetic recording head or a magnetic random-access memory (MRAM) for recording information in an ultra high-density information storage apparatus.

A magnetic random-access memory device is a memory device which stores data by using a resistance change in a magnetic tunneling junction (MTJ), which is a magnetoresistive structure. The magnetoresistive structure is formed to have a pinned layer and a free layer. A resistance of the magnetoresistive structure varies with a magnetization direction of the free layer. For example, if a magnetization direction of the free layer is the same as that of the pinning layer, the magnetoresistive structure may have a low resistance value. If a magnetization direction of the free layer is opposite to that of the pinning layer, the magnetoresistive structure may have a high resistance value. As such, if the magnetoresistive structure of the magnetic random-access memory device has a low resistance value, the low resistance value may correspond to, for example, data '0'. If the magnetoresistive structure of the magnetic random-access memory device has a high resistance value, the low resistance value may correspond to data '1'.

It is necessary to implement a high magnetoresistance (MR) ratio, so as to achieve a magnetic random-access memory device which has excellent characteristics. To achieve this, a lot of research is being conducted.

SUMMARY

Provided are magnetoresistive structures which have excellent magnetoresistive characteristics and may allow high degree of integration.

Provided are magnetic random-access memory devices that include a magnetoresistive structure which has excellent magnetoresistive characteristics and may allow high degree of integration.

Provided are methods of manufacturing a magnetoresistive structure.

According to example embodiments, a magnetoresistive structure includes a first magnetic layer having a magnetization direction that is fixed, a second magnetic layer corresponding to the first magnetic layer, wherein a magnetization direction of the second magnetic layer being changeable, and a magnetoresistance (MR) enhancing layer and an intermediate layer both between the first magnetic layer and the second magnetic layer.

An area of the second magnetic layer may be larger than an area of the first magnetic layer.

An area of the MR enhancing layer and an area of the intermediate layer may be each larger than the area of the first magnetic layer.

The MR enhancing layer may cover an upper surface and side surfaces of the first magnetic layer.

The second magnetic layer may cover an upper surface of the intermediate layer.

The MR enhancing layer may have a thickness of about 0.1 nm to 10 nm.

The first magnetic layer and the second magnetic layer may each include a material having a magnetic anisotropy that is horizontal.

The first magnetic layer and the second magnetic layer may each include a material having a magnetic anisotropy that is perpendicular.

According to example embodiments, a magnetic random-access memory device includes a switching structure; and a magnetoresistive structure connected to the switching structure, wherein the magnetoresistive structure includes a first magnetic layer having a magnetization direction that is fixed; a second magnetic layer corresponding to the first magnetic layer, wherein a magnetization direction of the second magnetic layer is changeable, and an magnetoresistance (MR) enhancing layer and an intermediate layer both between the first magnetic layer and the second magnetic layer.

According to example embodiments, a method of forming a magnetoresistive structure includes forming a first magnetic layer; forming a magnetoresistance (MR) enhancing layer and an intermediate layer on the first magnetic layer; and forming a second magnetic layer on the intermediate layer, wherein an area of the second magnetic layer is larger than an area of the first magnetic layer.

The MR enhancing layer may cover an upper surface and side surfaces of the first magnetic layer.

The forming of the first magnetic layer may include forming a capping layer and a sacrificial layer on a layer of a material of the first magnetic layer, forming a mask layer on the sacrificial layer; and forming the first magnetic layer using the mask layer in an etching process.

The forming of the first magnetic layer may include forming the first magnetic layer, applying an insulating material on the first magnetic layer to form a passivation layer, and removing the sacrificial layer to expose the capping layer using a chemical-mechanical polishing (CMP) process.

According to example embodiments, a magnetic random-access memory device includes a first magnetic layer having a fixed magnetization direction, a second magnetic layer operatively connected to the first magnetic layer, and a resistive structure separating the first magnetic layer from the second magnetic layer. The second magnetic layer extends over the first magnetic layer, and the second magnetic layer has a variable magnetization direction. The resistive structure includes at least one magnetoresistive layer and at least one intermediate layer.

A surface area of the second magnetic layer may be larger than a surface area of the first magnetic layer.

The first and second magnetic layers may have the same magnetic anisotropy.

The at least one magnetoresistive layer may cover at least one of an upper surface of the first magnetic layer and sidewalls of the first magnetic layer, and the at least one intermediate layer has a profile conformal with a profile of the at least one magnetoresistive layer.

The magnetic random-access memory device may further include at least one passivation layer covering the sidewalls of the first magnetic layer. The at least one passivation layer and the at least one magnetoresistive layer may collectively form a protective cap over the first magnetic layer.

The at least one intermediate layer may be stacked over the at least one magnetoresistive layer, and the at least one magnetoresistive layer may contact the first magnetic layer.

A width of the second magnetic layer may be larger than a width of the first magnetic layer.

BRIEF DESCRIPTION OF THE DRAWINGS

Example embodiments will be more clearly understood from the following detailed description taken in conjunction with the accompanying drawings. FIGS. 1-5 represent non-limiting, example embodiments as described herein.

FIG. 1 is a schematic diagram illustrating a cross-section of a magnetoresistive structure according to example embodiments;

FIG. 2 is a schematic diagram illustrating a cross-section of a magnetoresistive structure according to another embodiment;

FIG. 4 is a graph showing a magnetoresistance (MR) ratio of magnetoresistive structures formed according to example embodiments and a comparative example; and FIG. 5 is a schematic diagram illustrating a cross-section of a structure of a magnetic random-access memory device which includes a magnetoresistive structure, according to example embodiments.

DETAILED DESCRIPTION

Figure 1:
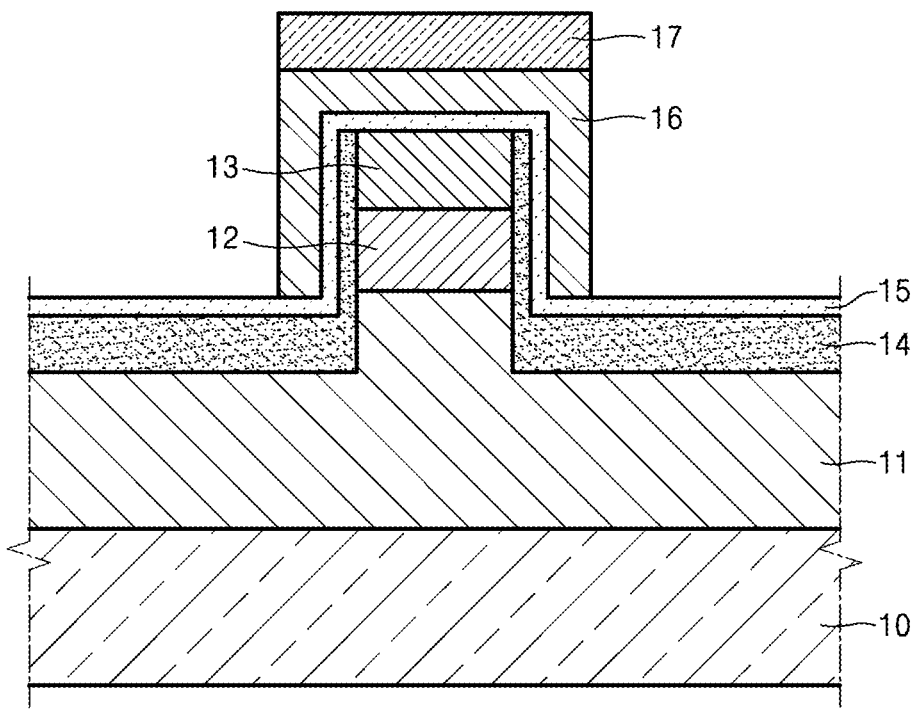

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

With regard to a magnetoresistive structure and a magnetic random-access memory device including the same according to example embodiments, reference will now be made in detail to embodiments, examples of which are illustrated in the accompanying drawings.

FIG. 1 is a schematic diagram illustrating a cross-section of a magnetoresistive structure according to example embodiments.

Referring to FIG. 1, according to example embodiments, a magnetoresistive structure may include a first magnetic layer 13, a second magnetic layer 17 which is formed to correspond to the first magnetic layer 13, and a magnetoresistance (MR) enhancing layer 15 and an intermediate layer 16 which are formed between the first magnetic layer 13 and the second magnetic layer 17.

According to example embodiments, the second magnetic layer 17 may be formed to have a larger area than the first magnetic layer 13. Additionally, the MR enhancing layer 15 and the intermediate layer 16 may each be formed to have a larger area than the first magnetic layer 13. The MR enhancing layer 15 and the intermediate layer 16 may be formed to have a three-dimensional (3D) structure that surrounds an upper surface and a side of the first magnetic layer 13. FIG. 1 shows a structure in which the second magnetic layer 17 is formed only on an upper surface of the intermediate layer 16. However, this is only an example, and the second magnetic layer 17 may be formed on a side of the intermediate layer 16, as well as on the upper surface of the intermediate layer 16. Additionally, a passivation layer 14 may be formed between the side of the first magnetic layer 13, and the MR enhancing layer 15.

The first magnetic layer 13 may be a pinned layer of which magnetization direction is fixed. The first magnetic layer 13 may be formed of a ferromagnetic material which is formed of a metal or an alloy that includes at least one material from among nickel (Ni), cobalt (Co) or iron (Fe). Also, the first magnetic layer 13 may further include boron (B), chrome (Cr), platinum (Pt), or palladium (Pd). For example, the first magnetic layer 13 may be formed of nickel iron (NiFe), cobalt iron (CoFe), nickel iron boron (NiFeB), cobalt iron boron (CoFeB), nickel iron silicon boron (NiFeSiB), or cobalt iron silicon boron (CoFeSiB). Additionally, in order to fix a magnetization direction of the first magnetic layer 13, a pinning layer 12 may be selectively further included below the first magnetic layer 13. The pinning layer 12 may be formed by using an antiferromagnetic layer or a synthetic antiferromagnetic (SAF) structure. If an antiferromagnetic layer is used as the pinning layer 12, the antiferromagnetic layer may be formed by using an alloy that includes manganese (Mn). For example, the antiferromagnetic layer may be formed by using an iridium manganese (IrMn), iron manganese (FeMn), or nickel manganese (NiMn) alloy. Instead of using the pinning layer 12, shape anisotropy of the first magnetic layer 13 may also be used to fix a magnetization direction of the first magnetic layer 13. The first magnetic layer 13 may be formed on a first electrode 11 so that a power source may be applied to the magnetic layer 13. The first electrode 11 may be formed on a lower structure 10 such as a substrate. The first electrode 11 may be formed to include a conductive material such as metal, conductive metal oxide, or conductive metal nitride.

Unlike the first magnetic layer 13, the second magnetic layer 17 may be formed so that a magnetization direction of the second magnetic layer 17 may be changed. The first magnetic layer 17 may be formed of a ferromagnetic material which is formed of a metal or an alloy that includes at least one material from among Ni, Co or Fe. Also, the second magnetic layer 17 may further include B, Cr, Pt, or Pd. For example, the second magnetic layer 17 may be formed of NiFe, CoFe, NiFeB, CoFeB, NiFeSiB, or CoFeSiB.

The MR enhancing layer 15 is applied to enhance an MR ratio of a magnetoresistive structure. The MR enhancing layer 15 is formed of at least one material from among Co, Fe, or Ni. Additionally, the MR enhancing layer 15 may be formed of an amorphous magnetic material that further includes B, Si, zirconium (Zr), or titanium (Ti). The MR enhancing layer 15 may be formed to have a thickness of about 0.1 nm to 10 nm.

The intermediate layer 16 may be formed to include an insulating material such as magnesium (Mg) oxide or aluminum (Al) oxide. However, the intermediate layer 16 is not limited to an insulating material. The intermediate layer 16 may be formed of a conductive material that includes at least one material from among ruthenium (Ru), copper (Cu), Al, gold (Au) and silver (Ag). The intermediate layer 16 may be formed to have a thickness of several nanometers, for example, 1 to 10 nm.

The passivation layer 14 may be formed of an insulating material, generally, a material of an interlayer insulating layer which is used for an electronic device. The passivation layer 14 may be formed of silicon oxide or silicon nitride.

Figure 2:
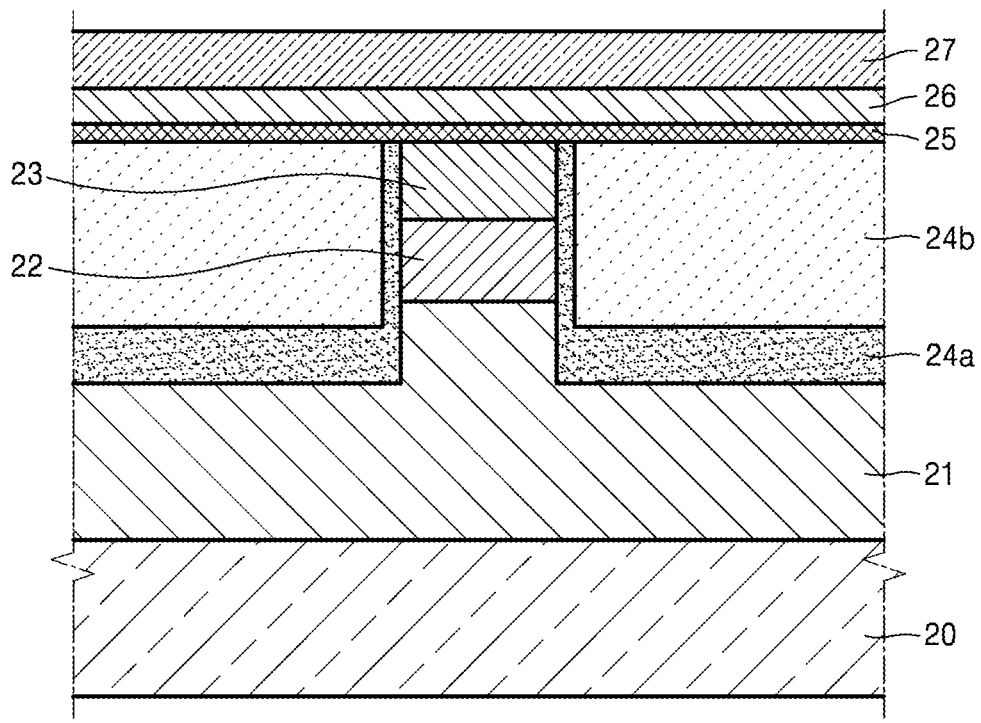

FIG. 2 is a schematic diagram illustrating a cross-section of a magnetoresistive structure according to example embodiments.

Referring to FIG. 2, according to example embodiments, the magnetoresistive structure may include a first magnetic layer 23, a second magnetic layer 27 which is formed to correspond to the first magnetic layer 23, and an MR enhancing layer 25 and an intermediate layer 26 which are formed between the first magnetic layer 23 and the second magnetic layer 27. Additionally, a first passivation layer 24*a* and a second passivation layer 24*b* may be formed at a side of the first magnetic layer 23.

The first magnetic layer 23 may be a pinned layer of which magnetization direction is fixed. In order to fix a magnetization direction of the first magnetic layer 23, a pinning layer 22 may be selectively further included below the first magnetic layer 23. The pinning layer 22 may be formed by using an antiferromagnetic layer or an SAF structure. Instead of using the pinning layer 22, shape anisotropy of the first magnetic layer 23 may also be used to fix a magnetization direction of the first magnetic layer 23. The first magnetic layer 23 may be formed on a first electrode 21 so that a power source may be applied to the first magnetic layer 23. The first electrode 21 may be formed on a lower structure 20 such as a substrate. The second magnetic layer 27 may be formed to have a larger area than the first magnetic layer 23. Additionally, the MR enhancing layer 25 and the intermediate layer 26 may each be formed to have a larger area than the first magnetic layer 23.

The descriptions about materials of each member shown in FIG. 1 may be also applied to the descriptions about materials of each member shown in FIG. 2 with the same name, such as a description about a thickness, According to the example embodiments shown in FIGS. 1 and 2, as examples, the first magnetic layers 13 and 23 and the second magnetic layers 17 and 27 have horizontal magnetic anisotropy. However, the first magnetic layers 13 and 23 and the second magnetic layers 17 and 27 are not limited thereto. The first magnetic layers 13 and 23 and the second magnetic layers 17 and 27 may also have perpendicular magnetic anisotropy. If the first magnetic layers 13 and 23 and the second magnetic layers 17 and 27 have perpendicular magnetic anisotropy, magnetic anisotropy energy may be about 106 to 107 erg/cc. In this case, the first magnetic layers 13 and 23 and the second magnetic layers 17 and 27 may respectively have a multi-layered structure in which a first layer, formed of at least one of Co and a Co alloy, and a second layer, formed of at least one from among Pt, Ni, and Pd, are alternately stacked. Otherwise, each of the first magnetic layers 13 and 23 and the second magnetic layers 17 and 27 may be an iron platinum (FePt) or cobalt platinum (CoPt) layer that has a L10 structure, or an alloy layer formed of a rare-earth element or a transition metal. A rare-earth element may be at least one of terbium (Tb) and gadolinium (Gd). A transition metal may be at least one of Ni, Fe, and Co.

Hereinafter, by referring to FIGS. 3A through 3K, a method of manufacturing a magnetoresistive structure according to example embodiments is described.

FIGS. 3A through 3K are diagrams illustrating a method of manufacturing a magnetoresistive structure according to example embodiments. Hereinafter, a method of manufacturing the magnetoresistive structure, shown in FIG. 1, will be described. According to example embodiments, each layer of the magnetoresistive structure may be formed by using a physical vapor deposition (PVD) or chemical vapor deposition (CVD) method.

Figure 3A:
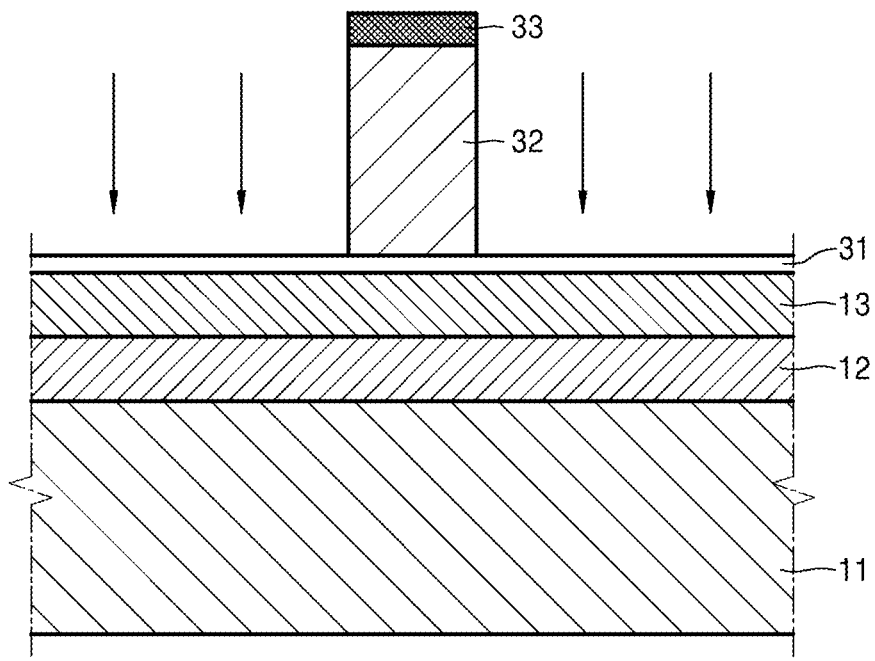
FIGS. 3A through 3K are diagrams illustrating a method of manufacturing of a magnetoresistive structure according to example embodiments.

Referring to FIG. 3A, a material of the first magnetic layer 13 is applied to a layer of a material of the first electrode 11 which is formed of a conductive material such as metal. The first magnetic layer 13 may be formed of a ferromagnetic material which is formed of a metal or an alloy that includes at least one material from among Ni, Co or Fe. Additionally, the first magnetic layer 13 may further include B, Cr, Pt, or Pd. For example, the first magnetic layer 13 may be formed of NiFe, CoFe, NiFeB, CoFeB, NiFeSiB, or CoFeSiB. In order to selectively fix a magnetization direction of the first magnetic layer 13, the pinning layer 12 may be first formed to be located below the first magnetic layer 13, before the first magnetic layer 13 is formed. If an antiferromagnetic layer is used as the pinning layer 12, the antiferromagnetic layer may be formed by using an alloy that includes Mn. For example, the antiferromagnetic layer may be formed by using an IrMn, FeMn, or NiMn alloy. A capping layer 31 is formed on a set (or, alternatively, predetermined) area of the first magnetic layer 13, and a sacrificial layer 32 and a mask layer 33 are formed on the capping layer 31.

Figure 3B:
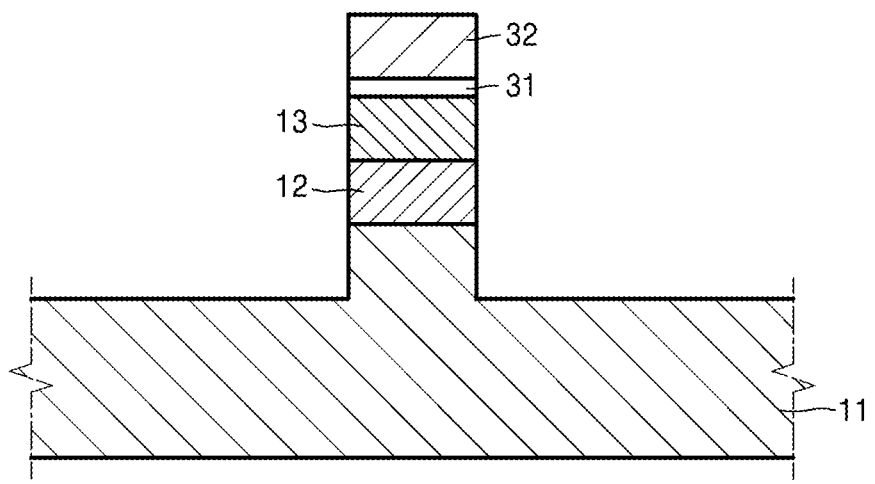

Referring to FIG. 3B, an etching process is performed on an area other than an area which is defined as the first magnetic layer 13 of the magnetoresistive structure, so that the first magnetic layer 13 may have the same width as the mask layer 33 and the sacrificial layer 32. An ion beam etching (IBE) method may be used for the etching process.

Figure 3C:
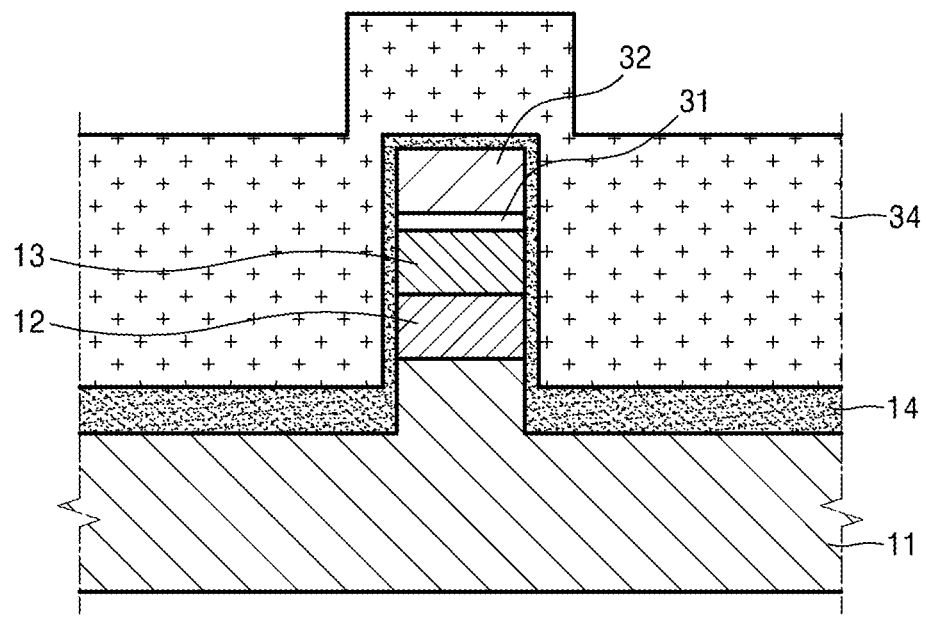

Referring to FIG. 3C, the passivation layers 14 and 34 may be formed on the first electrode 11 and the first magnetic layer 13. The passivation layers 14 and 34 may be formed to include the first passivation layer 14 and the second passivation layer 34. The passivation layers 14 and 34 may be formed of different materials from each other but are not limited thereto. The passivation layers 14 and 34 may be formed of an insulating material, such as a metal oxide or a metal nitride. For example, the first passivation layer 14 may be formed of Mg oxide, and the second passivation layer 34 may be formed of silicon oxide.

Figure 3D:
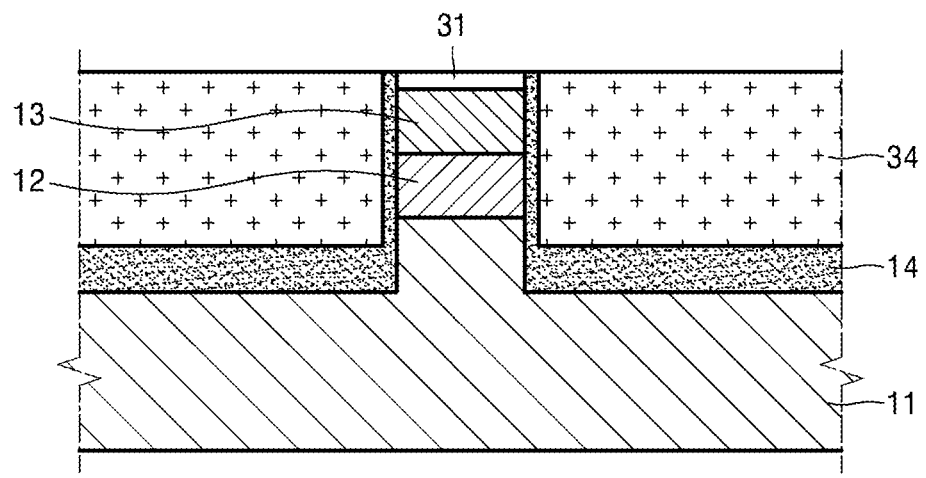

Referring to FIG. 3D, the sacrificial layer 32 and a partial area of the passivation layers 14 and 34 are removed by using, for example, a chemical-mechanical polishing (CMP) process, so as to expose an area on which the capping layer 31 is formed.

Figure 3E:
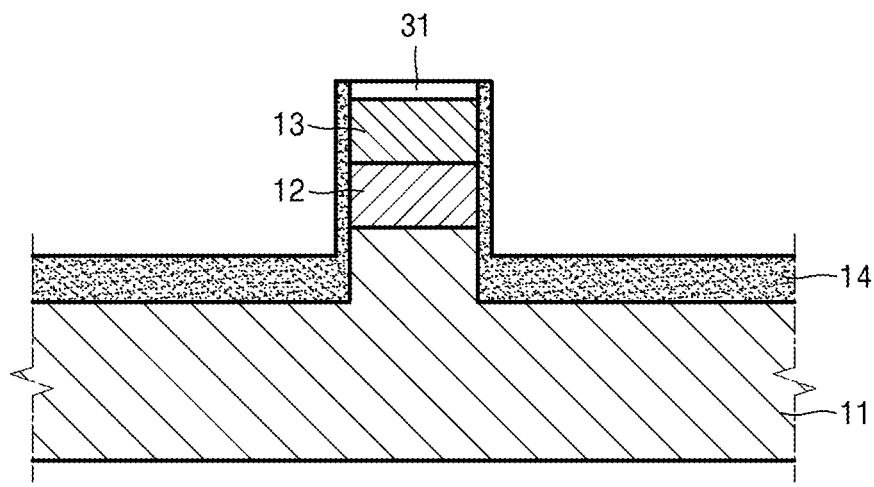

Additionally, referring to FIG. 3E, the second passivation layer 34 may be removed by using an etching process. For example, by using a reactive ion etching (RIE) process, the second passivation layer 34 may be removed, and thus the first passivation layer 14 may be exposed. If a CMP process or an etching process is performed, the capping layer 31 needs to be formed in order to protect the first magnetic layer 13.

Figure 3F:
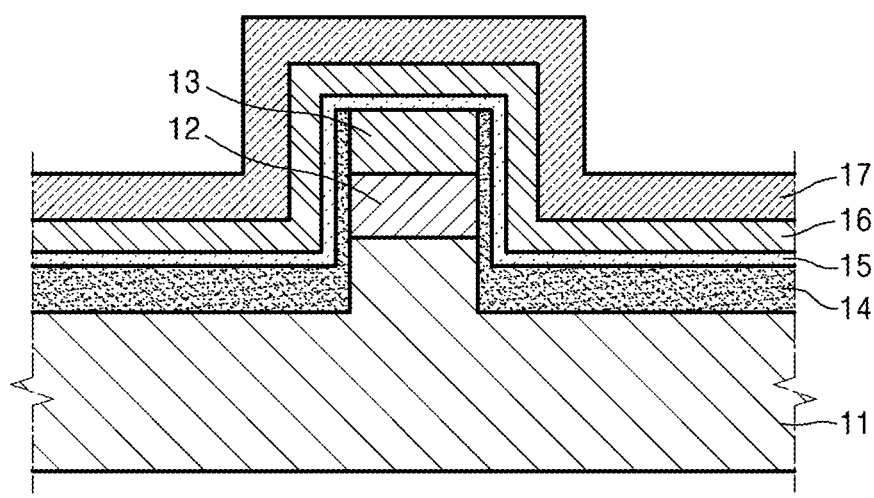

Referring to FIG. 3F, the capping layer 31 is removed, and then materials of the MR enhancing layer 15, the intermediate layer 16, and the second magnetic layer 17 may be sequentially deposited. The magnetoresistive structure, described herein, is manufactured according to the example embodiments described with regard to FIG. 1. Thus, materials of the MR enhancing layer 15, the intermediate layer 16, and the second magnetic layer 17 may be deposited to surround an upper surface and a side of the first magnetic layer 13.

If the magnetoresistive structure, according to example embodiments shown in FIG. 2, is to be formed, the second passivation layer 34 is not removed, and only the capping layer 31 is removed from the structure shown in FIG. 3D.

Then, materials of the MR enhancing layer 15, the intermediate layer 16, and the second magnetic layer 17 may be sequentially deposited directly on the first magnetic layer 13 and the second passivation layer 34.

Figure 3G:
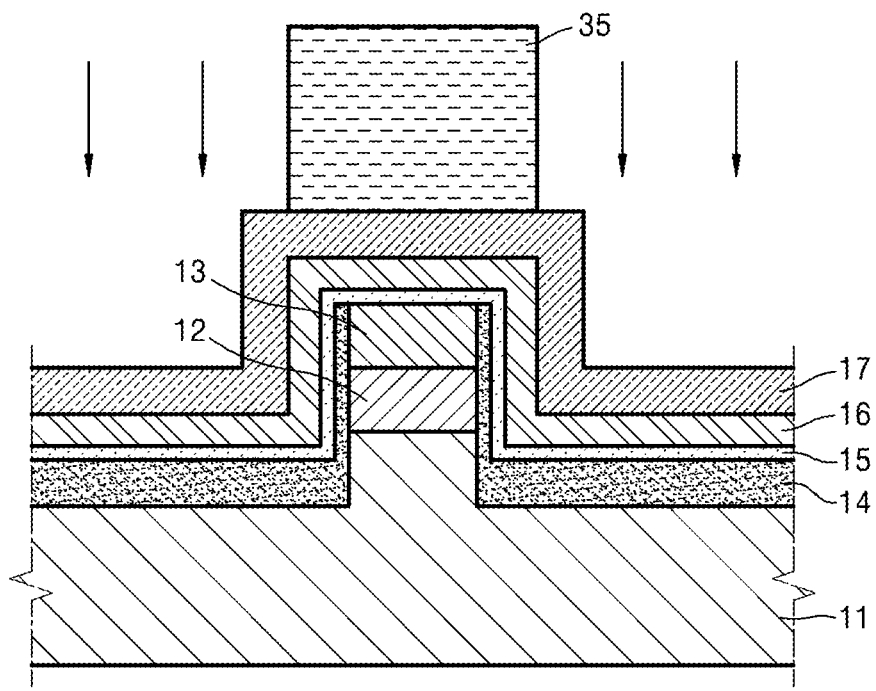

Referring to FIG. 3G, a second mask layer 35 is formed on the second magnetic layer 17 to have a desired width. Then, an etching process may be performed again by using an IBE method.

Figure 3H:
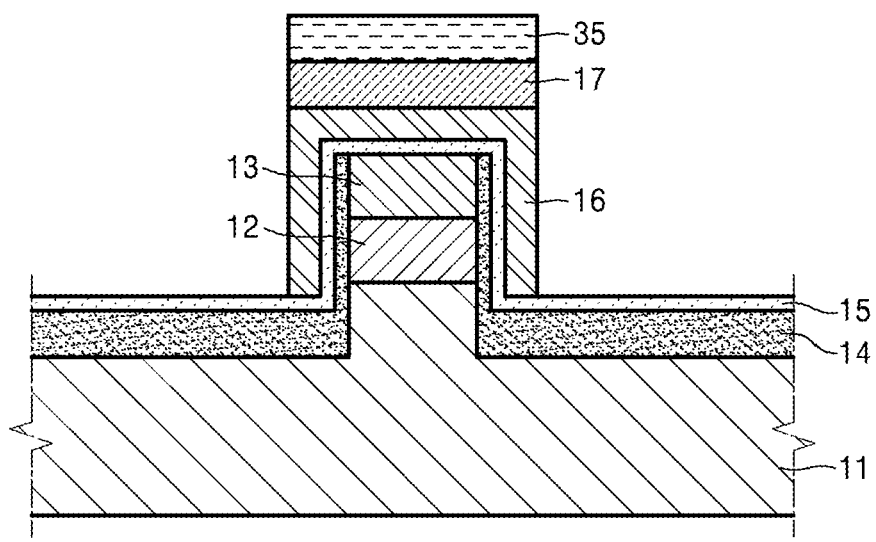

Referring to FIG. 3H, the intermediate layer 16 and the second magnetic layer 17 may be formed to have a desired shape by using the IBE method. Accordingly, a magnetoresistive structure that has the structure as shown in FIG. 1 may be formed. If the second mask layer 35 is formed to have a wider width, the second magnetic layer 17 may be formed to surround an upper surface and a side of the intermediate layer 16.

Figure 3I:
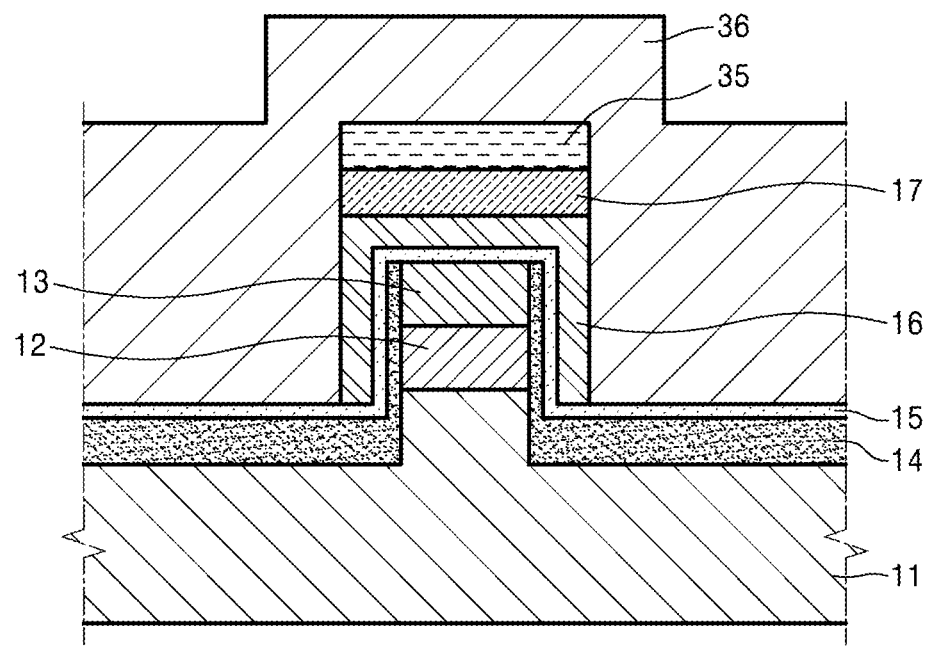
Figure 3J:
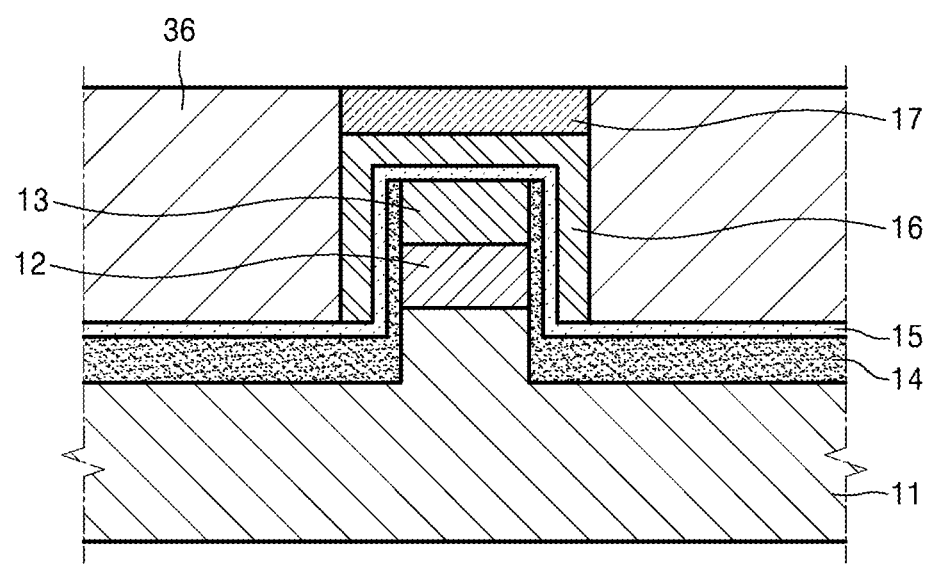
Figure 3K:
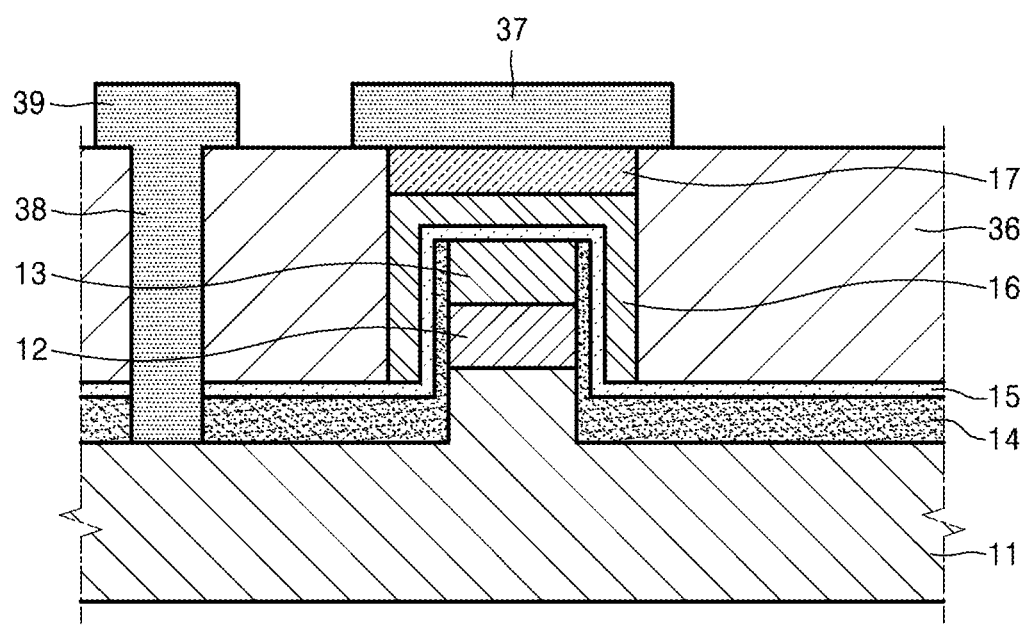

Additionally, an example of forming an electrode connection structure, which may apply a power source to the first magnetic layer 13 and the second magnetic layer 17, is described by referring to FIGS. 3I and 3K.

Referring to FIG. 3I, the insulating layer 36 is formed by applying a material such as silicon oxide or silicon nitride. Then, the second mask layer 35 is exposed by using a CMP process or so on, and then the second magnetic layer 17 is exposed by removing the second mask layer 35.

Then, referring to FIG. 3K, a hole 38 is formed on the insulating layer 36, and thus the first electrode 11 is exposed. Then, by depositing a conductive material, connection electrodes 37 and 39 may be respectively formed. An insulating layer may be further formed at a side of the hole 38, so that insulation between the MR enhancing layer 15 and the connection electrode 39 may be maintained.

Figure 4:
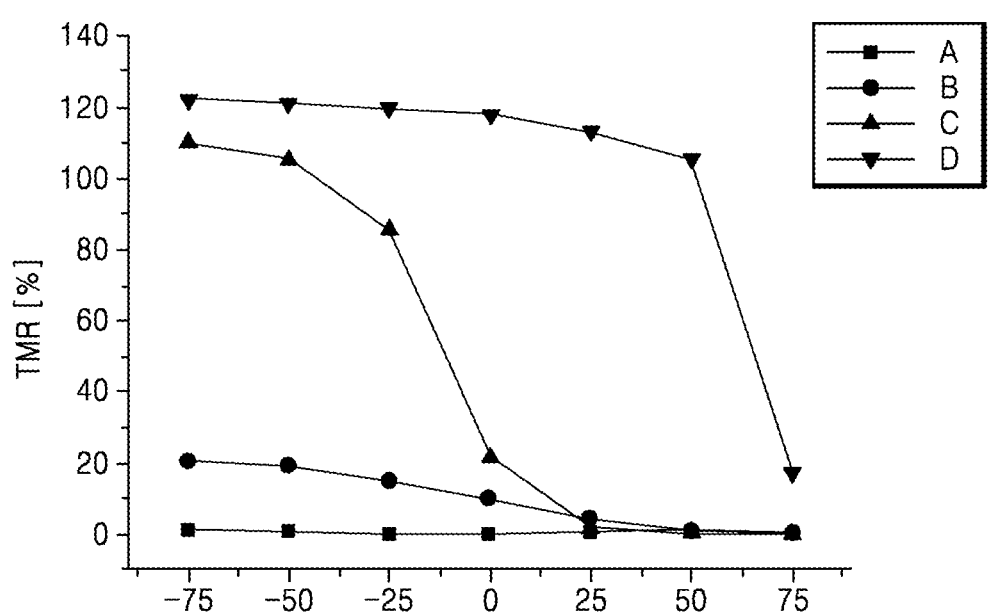

FIG. 4 is a graph showing a magnetoresistance (MR) ratio of magnetoresistive structures formed according to example embodiments and a comparative example. The graph, shown in FIG. 4, shows an MR ratio according to whether the MR enhancing layer is formed.

An object specimen, shown in FIG. 4, includes a magnetoresistive structure in which a PtMn layer was formed as an antiferromagnetic layer, a CoFe layer was formed on the PtMn layer as a first magnetic layer, an Ru layer was formed as an intermediate layer, and then a CoFeB layer was formed on the Ru layer as a second magnetic layer. An Ru layer was further formed on a surface of the second magnetic layer. In FIG. 4, 'A' and 'B' are specimens that do not include an additional MR enhancing layer, and 'C' and 'D' are specimens that further include an MR enhancing layer which was formed as a CoFeB layer between the first magnetic layer and the intermediate layer. A horizontal axis in the graph shown in FIG. 4 represents a thickness of the Ru layer formed on a surface of each specimen. A radio frequency (RF) etching was performed on the specimens 'A' and 'C' for about 120 seconds. An RF etching was performed on the specimens 'B' and 'D' for about 180 seconds. Then, an MR ratio was measured.

FIG. 4 shows that a transmission medium requirement (TMR) value, obtained from 'C' and 'D' which include the MR enhancing layer, differs greatly from a TMR value, and obtained from 'A' and 'D' which do not additionally include the MR enhancing layer.

According to example embodiments, the magnetoresistive structure may be applied to various types of electronic devices or magnetic devices. For example, the magnetoresistive structure may be applied to a magnetic random-access memory device.

Figure 5:
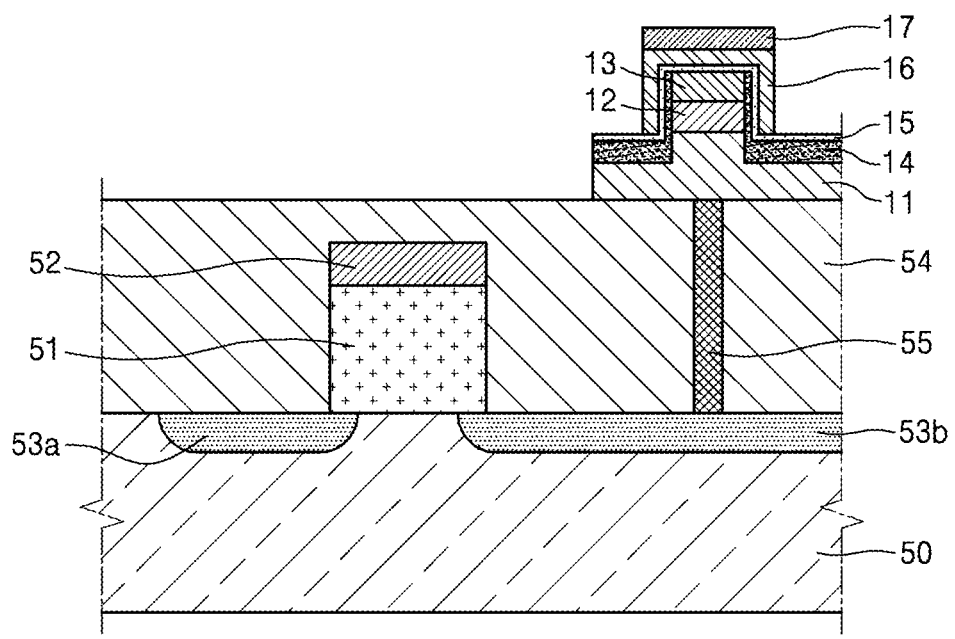

FIG. 5 is a schematic diagram illustrating a cross-section of a structure of a magnetic random-access memory device which includes a magnetoresistive structure, according to example embodiments.

The magnetoresistive structure in the current example embodiment may be connected to a switching structure. FIG. 5 shows the magnetic random-access memory device in which the magnetoresistive structure is connected to a transistor structure.

Referring to FIG. 5, the switching structure is described. A gate structure, which includes a gate insulating layer 51 and a gate electrode 52, is formed on a substrate 50. A channel may be formed in a region of the substrate 50 below the gate structure, and areas of a source 53a and a drain 53b may be formed at both sides of the channel. Locations of the source 53a and the drain 53b may be interchanged. The drain 53b in the switching structure may also be connected to the first electrode 11 shown in FIG. 1, via an interlayer insulating layer 54.

As described above, according to the one or more of the above example embodiments, provided is the magnetoresistive structure, in which the second magnetic layer is formed to have a wider area compared to the first magnetic layer, and in which the MR enhancing layer is included; thus, the magnetoresistive structure has a high MR ratio. Additionally, provided is a magnetic device which has a high degree of integration, which is achieved by forming the magnetoresistive structure to have a 3D structure.

It should be understood that the example embodiments described therein should be considered in a descriptive sense only and not for purposes of limitation. For example, numerous modifications of the magnetoresistive structure shown in FIGS. 1 and 2 will be readily apparent to those skilled in this art without departing from the spirit and scope. Additionally, according to the example embodiments, the magnetoresistive structure may be applied to not only the magnetic random-access memory device shown in FIG. 5, but also to a memory device which has a different structure or a magnetic device other than the memory device. Therefore, the scope of the invention is defined not by the detailed description of the invention but by the appended claims, and all differences within the scope will be construed as being included in the present invention.

What is claimed is:

1. A magnetoresistive structure, comprising:
   a first magnetic layer having a fixed magnetization direction, the first magnetic layer including an upper surface, a lower surface and side surfaces perpendicular to the upper surface and the lower surface;
   a second magnetic layer operatively connected to the first magnetic layer, the second magnetic layer having a changeable magnetization direction; and
   a magnetoresistance (MR) enhancing layer and an intermediate layer both between the first magnetic layer and the second magnetic layer, wherein a first portion of the MR enhancing layer surrounds the upper surface and the side surfaces of the first magnetic layer, an inner surface of the intermediate layer has a profile conformal to a profile of the first portion of the MR enhancing layer, and the second magnetic layer is operatively connected to the intermediate layer such that a total surface area of the second magnetic layer is larger than a total surface area of the first magnetic layer.

2. The magnetoresistive structure of claim 1, wherein a total surface area of the MR enhancing layer and a total surface area of the intermediate layer are each larger than the total surface area of the first magnetic layer.

3. The magnetoresistive structure of claim 1, wherein the second magnetic layer covers an upper portion of an outer surface of the intermediate layer.

4. The magnetoresistive structure of claim 1, wherein the MR enhancing layer has a thickness of about 0.1 nm to about 10 nm.

5. The magnetoresistive structure of claim 1, wherein the first magnetic layer and the second magnetic layer each include a material having a horizontal magnetic anisotropy.

6. The magnetoresistive structure of claim 1, wherein the first magnetic layer and the second magnetic layer each include a material having a perpendicular magnetic anisotropy.

7. A magnetic random-access memory device, comprising:
- a switching structure; and
- a magnetoresistive structure connected to the switching structure, the magnetoresistive structure including,
  - a first magnetic layer having a fixed magnetization direction, the first magnetic layer including an upper surface, a lower surface and side surfaces perpendicular to the upper surface and the lower surface,
  - a second magnetic layer operatively connected to the first magnetic layer, the second magnetic layer having a changeable magnetization direction, and
  - a magnetoresistance (MR) enhancing layer and an intermediate layer both between the first magnetic layer and the second magnetic layer, wherein a first portion of the MR enhancing layer surrounds the upper surface and the side surfaces of the first magnetic layer, an inner surface of the intermediate layer has a profile conformal to a profile of the first portion of the MR enhancing layer, and the second magnetic layer is operatively connected to the intermediate layer such that a total surface area of the second magnetic layer is larger than a total surface area of the first magnetic layer.

8. The magnetic random-access memory device of claim 7, wherein a total surface area of the MR enhancing layer and a total surface area of the intermediate layer are each larger than the total surface area of the first magnetic layer.

9. The magnetic random-access memory device of claim 7, wherein the second magnetic layer covers an upper portion of an outer surface of the intermediate layer.

10. The magnetic random-access memory device of claim 7, wherein the MR enhancing layer has a thickness of about 0.1 nm to about 10 nm.

11. The magnetic random-access memory device of claim 7, wherein the first magnetic layer and the second magnetic layer each include a material having a horizontal magnetic anisotropy.

12. The magnetic random-access memory device of claim 7, wherein the first magnetic layer and the second magnetic layer each include a material having a perpendicular magnetic anisotropy.

13. A magnetic random-access memory device, comprising:
- a first magnetic layer having a fixed magnetization direction, the first magnetic layer including an upper surface, a lower surface and side surfaces perpendicular to the upper surface and the lower surface;
- a second magnetic layer operatively connected to the first magnetic layer and the second magnetic layer extends over the first magnetic layer, the second magnetic layer having a variable magnetization direction; and
- a resistive structure separating the first magnetic layer and the second magnetic layer, the resistive structure including at least one magnetoresistive layer and at least one intermediate layer, wherein a first portion of the at least one magnetoresistive layer surrounds the upper surface and the side surfaces of the first magnetic layer, an inner surface of the at least one intermediate layer has a profile conformal to a profile of the first portion of the at least one magnetoresistive layer, and the second magnetic layer is operatively connected to the intermediate layer such that a total surface area of the second magnetic layer is larger than a total surface area of the first magnetic layer.

14. The magnetic random-access memory device of claim 13, wherein the first magnetic layer has a magnetic anisotropy equal to the magnetic anisotropy of the second magnetic layer.

15. The magnetic random-access memory device of claim 13, further comprising:
- at least one passivation layer covering the side surfaces of the first magnetic layer, wherein,
  - the at least one passivation layer and the at least one magnetoresistive layer collectively form a protective cap over the first magnetic layer.

16. The magnetic random-access memory device of claim 13, wherein
- the at least one intermediate layer is stacked over the at least one magnetoresistive layer, and
- the at least one magnetoresistive layer contacts the first magnetic layer.

17. The magnetic random-access memory device of claim 13, wherein a width of the second magnetic layer in a direction perpendicular to a direction in which the first and the second magnetic layers are stacked is larger than a corresponding width of the first magnetic layer.

* * * * *